United States Patent
Chiu et al.

(10) Patent No.: US 10,607,871 B2
(45) Date of Patent: Mar. 31, 2020

(54) RETICLE PRESSING UNIT AND EUV RETICLE POD USING SAME

(71) Applicant: Gudeng Precision Industrial Co., LTD, New Taipei (TW)

(72) Inventors: Ming-Chien Chiu, New Taipei (TW); Chia-Ho Chuang, New Taipei (TW); Hsin-Min Hsueh, New Taipei (TW)

(73) Assignee: GUDENG PRECISION INDUSTRIAL CO., LTD, New Taipei (TW)

( * ) Notice: Subject to any disclaimer, the term of this patent is extended or adjusted under 35 U.S.C. 154(b) by 0 days.

(21) Appl. No.: 16/232,164

(22) Filed: Dec. 26, 2018

(65) Prior Publication Data

US 2019/0214287 A1    Jul. 11, 2019

Related U.S. Application Data

(60) Provisional application No. 62/616,110, filed on Jan. 11, 2018, provisional application No. 62/751,754, filed on Oct. 29, 2018.

(51) Int. Cl.
*H01L 21/673* (2006.01)
*G03F 7/20* (2006.01)
*G03F 1/66* (2012.01)

(52) U.S. Cl.
CPC ......... *H01L 21/67359* (2013.01); *G03F 1/66* (2013.01); *G03F 7/70741* (2013.01);
(Continued)

(58) Field of Classification Search
CPC ......... H01L 21/67359; H01L 21/67353; H01L 21/386; B65D 25/10; G03F 7/70741; G03F 7/70733; G03F 1/66
(Continued)

(56) References Cited

U.S. PATENT DOCUMENTS 8,220,630 B1 * 7/2012 Ku ...................... G03F 7/70741
206/454
8,418,853 B2 * 4/2013 Ku ...................... H01L 21/67359
206/454
(Continued)

FOREIGN PATENT DOCUMENTS

| CN | 102789132 B | 7/2014 |
| EP | 1928764 B1 | 11/2011 |
| TW | I501910 B | 10/2015 |

*Primary Examiner* — Steven A. Reynolds
(74) *Attorney, Agent, or Firm* — WPAT, PC

(57) ABSTRACT

A reticle pressing unit and an EUV reticle pod using the same are provided. An inner assembly includes an upper cover and a lower cover. The lower cover includes a supporting element for supporting the reticle. A pressing unit for pressing the reticle is disposed on the upper cover and includes a pressing element and a limiting cap. The pressing element has oppositely arranged pressing part and pressure receiving part. The pressing part extends through the upper cover to press against the reticle. The pressing element is covered by the limiting cap and is protruded outwardly from a top surface of the limiting cap. An outer cover has a pushing surface for forming a surface-to-surface contact with the pressure receiving part and for simultaneously pressing against the pressure receiving part and the top surface to solve the problems relating to the reticle which is applied with uneven forces.

9 Claims, 6 Drawing Sheets

(52) U.S. Cl.
CPC .. *H01L 21/67353* (2013.01); *H01L 21/67369* (2013.01); *H01L 21/67386* (2013.01)

(58) Field of Classification Search
USPC .................. 206/710, 454, 711, 722, 723
See application file for complete search history.

(56) References Cited

U.S. PATENT DOCUMENTS

| | | | | |
|---|---|---|---|---|
| 8,446,570 | B2* | 5/2013 | Del Puerto | B82Y 10/00 355/72 |
| 9,022,216 | B2* | 5/2015 | Ku | B65D 85/48 206/454 |
| 2012/0175279 | A1* | 7/2012 | Ku | G03F 1/66 206/454 |
| 2013/0126378 | A1* | 5/2013 | Ku | B65D 85/48 206/454 |
| 2014/0183076 | A1* | 7/2014 | Kolbow | G03F 1/66 206/454 |
| 2015/0266660 | A1* | 9/2015 | Lystad | H01L 21/67359 206/454 |
| 2017/0294326 | A1* | 10/2017 | Raschke | H01L 21/67011 |
| 2018/0210349 | A1* | 7/2018 | Hsueh | H01L 21/67353 |

* cited by examiner

RETICLE PRESSING UNIT AND EUV RETICLE POD USING SAME

RELATED APPLICATIONS

This application claims priority to U.S. Provisional Patent Application Ser. No. 62/616,110, by CHIU, et al., titled "HOLD DOWN PIN WITH FIXED TRAVEL DISTANCE," filed Jan. 11, 2018, and U.S. Provisional Patent Application Ser. No. 62/751,754, by CHUANG, et al., titled "EUV POD EIP RETICLE CONTACT POINT DESIGN," filed Oct. 29, 2018, which are hereby incorporated by reference herein in their entirety.

BACKGROUND OF THE INVENTION

Technical Field

The present invention relates to a reticle pod. More particularly, the present invention relates to an EUV reticle pod having a reticle pressing unit.

Description of Related Art

Along with the rapid advance in semiconductor manufacturing technology, the linewidth of the semiconductor has been miniaturized, and the efficiency of the memory, the chip, the processor, or other component in the electronic device has been drastically increased while maintaining the size and the power consumption. A major reason of achieving the miniature of the linewidth is the increment in resolution of the patterning process of the photolithography technology. In order to perform an extremely high-resolution exposure and developing process, an extreme ultraviolet light source having extremely short wavelength has been used in the photolithography equipment by the industry in recent years. Under such extreme exposure condition, the exposure environment, the semiconductor manufacturing equipment, and even the semiconductor manufacturing component all require a higher standard for cleanliness.

In order to keep the reticle clean, the reticle used in the photolithography process is usually contained in a contamination-resistant container during manufacturing, transporting, storage, or other processing stages. The container itself is made of low-particle-generating material and is used for isolating the reticle from the outside environment, preventing the reticle from being contacted and contaminated by outside particles or chemical gases. Generally, in advanced semiconductor fabs, the reticle container is required to meet the standard mechanical interface (SMIF) requirement for cleanliness.

One known method is to utilize a dual-structure container to contain the reticle to separate the reticle from the outside environment. As described in Taiwan patent No. I501910, titled "EUV POD WITH DRAIN APPARATUS," issued on Oct. 1, 2015, an inner pod is used for supporting the reticle, and an outer pod is used for fixing the inner pod. A second support element is disposed on the upper cover of the outer pod.

In the section [0024] and FIG. 7 of said patent, when the upper cover is closing on, the movement of the upper cover will force the second support element (the element numbered 32) to press and to push down the exposed part of the fixing element (the element numbered 40) in the through hole. After the fixing element 40 is pressed, it will go further down, so the supporting pole (the element numbered 401)) would also be pressed downwardly and be in contact with the four corners of the upper surface of the reticle.

However, in said patent, the second support element 32 applies force to the fixing element 40 in a single-point-contact manner. When the force applying location of the second support element 32 and the force receiving location of the fixing element 40 are misaligned for the reasons such as the accumulation of assembly tolerance of the reticle pod, or any other reasons, the fixing element 40 will not be pressed evenly. As matter of fact, the fixing element 40 may even be tilted, and different fixing elements 40 will have different tilted angles and will be applied with different forces. When the fixing elements 40 are pressed unevenly, the forces applying to the reticle from the fixing elements 40 will also be uneven and difficult to control. Subsequently, the reticle applied with uneven forces by the fixing elements 40 will crack and damage easily and the reticle may not be held in the right position as well, and therefore during transporting the reticle, the reticle is likely subject to movement within the reticle pod, particles will be generated, and the reticle will be damaged easily.

Therefore, there exists a need for a reticle pod that can steadily fix the reticle and evenly apply force to the reticle, so that the above-mentioned problems can be solved.

SUMMARY

In view of the above-mentioned problems, the present invention is to provide a reticle pressing unit and an EUV reticle pod using the reticle pressing unit. By using a pushing surface of an outer cover to form a surface-to-surface contact with a pressure receiving part of a pressing element, the problems relating to tilted pressing element and uneven forces applied to different pressing elements can be avoided. Moreover, by using the pushing surface to simultaneously press against a top surface of a limiting cover and the pressure receiving part, the amount of the force and the travel distance of pushing can be controlled, and the problems relating to the reticle applied with uneven forces can be solved.

According to one aspect of the invention, an EUV reticle pod is provided. The EUV reticle pod includes an inner assembly for containing the reticle and an outer assembly for containing the inner assembly. The inner assembly includes a lower cover, an upper cover for engaging with the lower cover, and a pressing unit. The lower cover includes a supporting element for supporting the reticle. The pressing unit is disposed on the upper cover for pressing the reticle. The pressing unit includes a pressing element and a limiting cap. The pressing element has a pressing part and a pressure receiving part which are oppositely arranged, and the pressing part extends through the upper cover for pressing against the reticle. The limiting cap is disposed on the upper cover and covers the pressing element, and the pressure receiving part extends through the limiting cap and is protruded outwardly from a top surface of the limiting cap. The outer assembly includes a base and an outer cover for engaging with each other. The outer cover has a pushing surface for forming a surface-to-surface contact with the pressure receiving part and for simultaneously pressing against the pressure receiving part and the top surface.

In one embodiment, the pressing element further has a shoulder part whose two sides respectively connected to the pressure receiving part and the pressing part, and the shoulder part is confined between the limiting cap and the upper cover. The pressing unit further includes an elastic element disposed between the upper cover, and the shoulder part is used for elastically contacting with the shoulder part. The pressing part extends through a through hole of the upper cover, and the elastic element has a circular structure surrounding the through hole.

In another embodiment, the pressing element further has a shoulder part whose two sides respectively connected to the pressure receiving part and the pressing part, and the shoulder part is confined between the limiting cap and the upper cover. The pressure receiving part extends through a window of the limiting cap, and a width of the shoulder part is greater than a width of the pressure receiving part and a width of the window.

In yet another embodiment, the pressing element has a travel distance, and the top surface and an upper surface of the pressure receiving part are situated on the same horizontal level when the pressing element reaches one end of the travel distance.

In a further embodiment, the reticle is touched by the pressing element through one or more contact points.

In another embodiment, the reticle is touched by the supporting element through one or more supporting points.

In yet another embodiment, the lower cover includes more than one of the supporting elements disposed near the corners of the reticle, and each corner is supported by one of the supporting elements, and the upper cover includes more than one of the pressing units corresponding to the supporting elements, and each corner is pressed by one of the pressing units.

According to another aspect of the invention, a pressing unit for a reticle which is configured to be used in an EUV reticle pod is provided. The EUV reticle pod includes an outer cover, a lower cover, and an upper cover for engaging with the lower cover to contain the reticle. The pressing unit includes a pressing element and a limiting cap. The pressing element has a pressing part and a pressure receiving part which are oppositely arranged, and the pressing part extends through the upper cover for pressing against the reticle. The limiting cap is disposed on the upper cover and covers the pressing element, and the pressure receiving part extends through the limiting cap and is protruded outwardly from a top surface of the limiting cap. The outer cover and the reticle are respectively situated on two opposite sides of the upper cover, and the outer cover has a pushing surface for forming a surface-to-surface contact with the pressure receiving part and for simultaneously pressing against the pressure receiving part and the top surface.

According to the disclosure of the embodiments of the invention, the outer cover has the pushing surface for forming the surface-to-surface contact with the pressure receiving part of the pressing element, and for simultaneously pressing against the pressure receiving part of the pressing element and the top surface of the limiting cap. Therefore, the situation of having difficulty in controlling the amount of the force and the travel distance of the pressing element can be prevented, and damages on the reticle can be prevented accordingly. The problems relating to the reticle not being held in the right position can also be solved.

BRIEF DESCRIPTION OF DRAWINGS

The invention can be more fully understood by reading the following detailed description of the embodiment, with reference made to the accompanying drawings as follows.

DETAILED DESCRIPTION

According to the embodiments of the invention, of a reticle pressing unit and an EUV reticle pod using the same, a pushing surface of an outer cover is used to form a surface-to-surface contact with a pressing element, and the pushing surface simultaneously presses against the pressing element and a limiting cap. The pressing force and the travel distance of the pressing element can be controlled, the excess amount of pressure can be suppressed, and the overall pressure applying to the reticle can be limited. The problems relating to the reticle being applied with uneven forces can be avoided.

Figure 1:
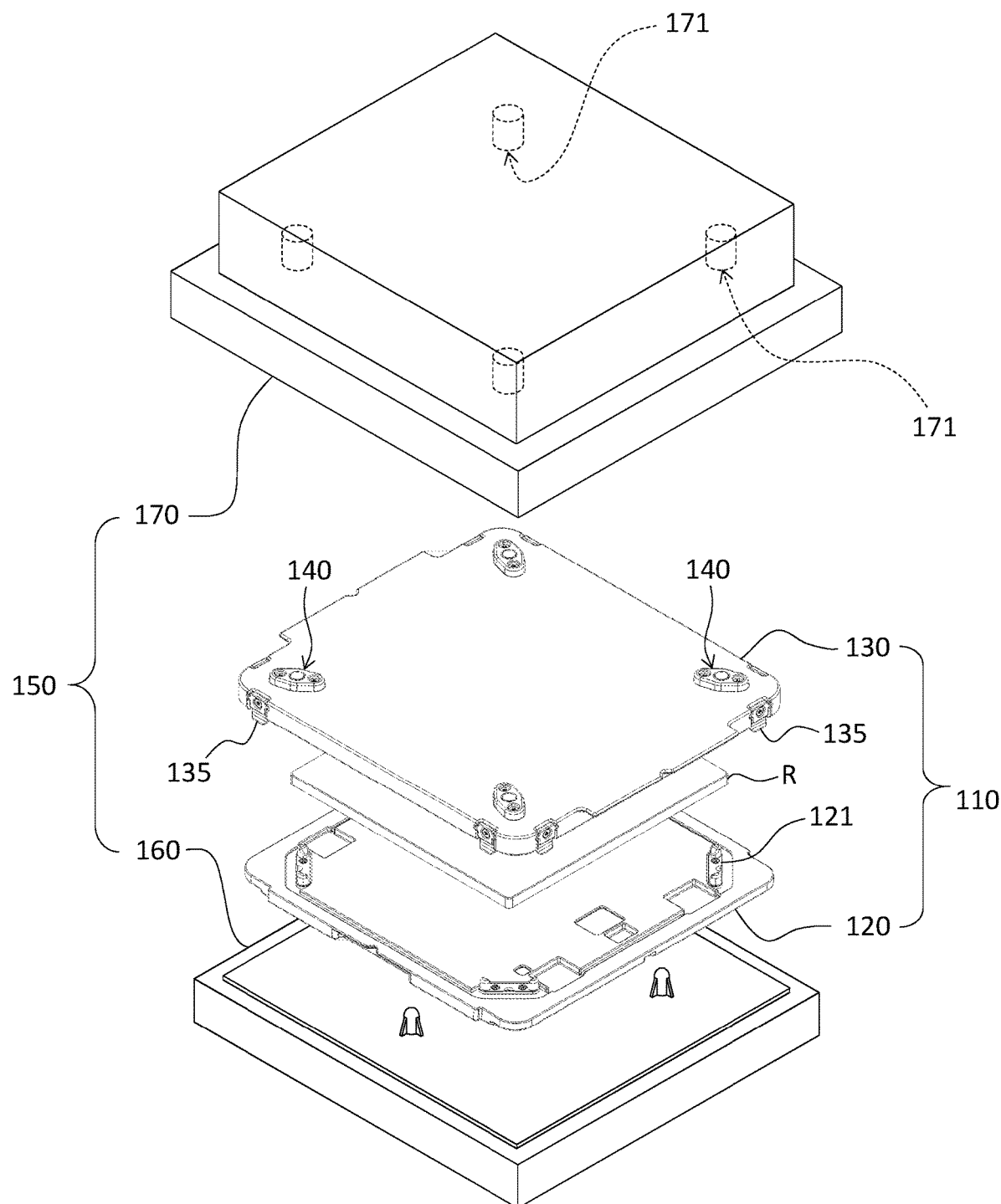
FIG. 1 is a schematic diagram of an EUV reticle pod according to one embodiment of the invention.
Figure 2:
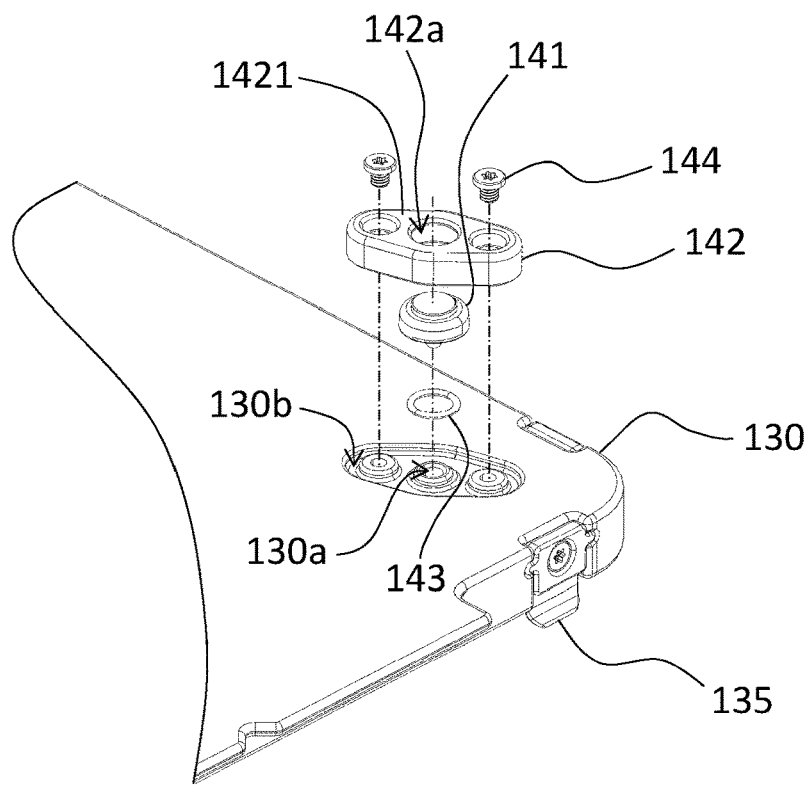
FIG. 2 is an exploded view of one of the pressing units of FIG. 1.
Figure 3:
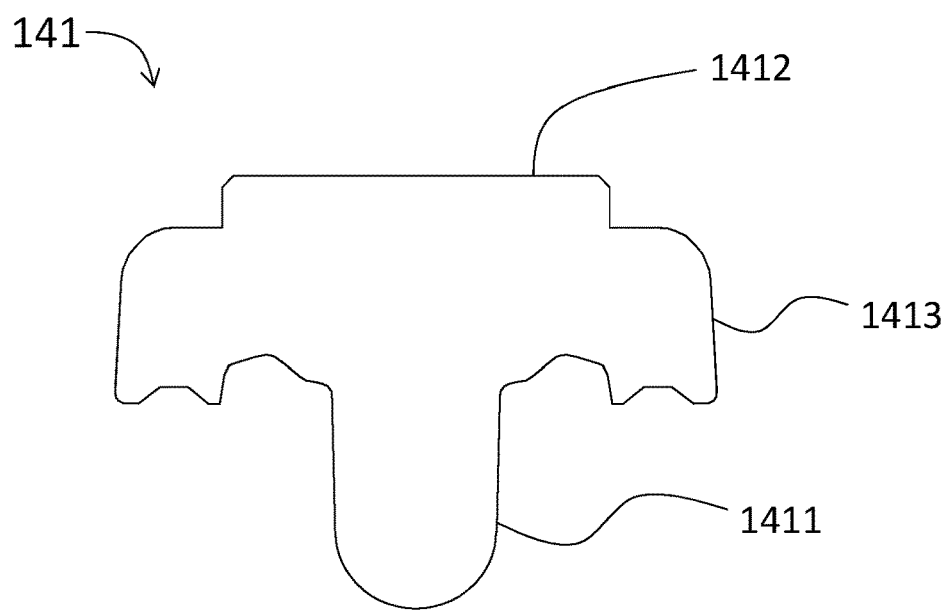
FIG. 3 is a cross-sectional view of the pressing element.

Please refer to FIG. 1 to FIG. 3. FIG. 1 is a schematic diagram of an EUV reticle pod according to one embodiment of the invention. FIG. 2 is an exploded view of one of the pressing units of FIG. 1. FIG. 3 is a cross-sectional view of the pressing element.

The EUV reticle pod 100 includes an inner assembly 110 and an outer assembly 150. The inner assembly 110 is used for containing a reticle R and includes a lower cover 120 and an upper cover 130. The lower cover 120 includes a supporting element 121 for supporting the reticle R. The upper cover 130 is used for engaging with the lower cover 120 and includes a pressing unit 140 disposed thereon for pressing the reticle R. The pressing unit 140 includes a pressing element 141 and a limiting cap 142. The pressing element 141 has a pressing part 1411 and a pressure receiving part 1412 which are oppositely arranged. The pressing part 1411 extends through the upper cover 130 to press against the reticle R. The limiting cap 142 is disposed on the upper cover 130 and covers the pressing element 141. The limiting cap 142 has a top surface 1421. The pressure receiving part 1412 extends through the limiting cap 142 and is protruded upwardly from the top surface 1421. The outer assembly 150 is used for containing the inner assembly 110 and includes a base 160 and an outer cover 170 that are used for engaging with each other. The outer cover 170 has a pushing surface 171 for forming a surface-to-surface contact with the pressure receiving part 1412, and for simultaneously pressing against the pressure receiving part 1412 and the top surface 1421.

In the present embodiment, the pressing element 141 further has a shoulder part 1413 whose two sides are respectively connected to the pressure receiving part 1412 and the pressing part 1411. As the pressing to element 141 covered by the limiting cap 142, the shoulder part 1413 is confined between the limiting cap 142 and the upper cover 130, such that the pressing element 141 can be prevented from moving out of the two, and a travel distance of the pressing element 141 can be determined. (The way the pressing element 141 moves and its travel distance will be elaborated in the below.) In one embodiment, the pressing element 141 can be exemplified by an integrally-formed structure of an erosion-resistance polymer, which not only reduces particles but also increases the structural strength to properly transmit the force. The pressing element 141 can also has the advantages including simple structure and low manufacturing cost.

In the present embodiment, the upper cover 130 has a through hole 130a and the limiting cap 142 has a window 142a. The pressing part 1411 extends through the through hole 130a and the pressure receiving part 1412 extends through the window 142a. The width of the shoulder part 1413 of pressing element 141 is greater than the width of the pressure receiving part 1412 and the width of the windows 142a, so the shoulder part 1413 can be confined between the limiting cap 142 and the upper cover 130.

The pressing unit 140 further includes an elastic element 143 disposed between the upper cover 130 and the shoulder part 1413 of the pressing element 141 for elastically contacting the shoulder part 1413. The elastic element 143 has a circular structure that surrounds the through hole 130a of the upper cover 130. The elastic element 143 can be exemplified by an O-ring that provides buffer while the pressing element 141 is pressed and provides a certain degree of air-tightness between the pressing element 141 and the upper cover 130. Therefore, this location will not become an airflow channel, and the overall air-tightness of the inner assembly 110 will not be affected.

In the present embodiment, the pressing unit 140 includes a first screwing element 144 for screwing the limiting cap 142 onto the upper cover 130. As shown in FIG. 2, the upper cover 130 has a recess 130b corresponding to the contour of the limiting cap 142 to receive the limiting cap 142 and to fix the position of the limiting cap 142. After being screwed into the recess 130b by the first screwing element 144, the limiting cap 142 can be firmly fixed and will not be shifted or moved away from its location. In the present embodiment, the limiting cap 142 is screwed onto the upper cover 130 by way of the first screwing element 144; however, the technology of the present invention is not limited to the first screwing element 144; any other means for fixing the limiting cap 142 onto the upper cover 130 are eligible to be used herein.

Please continue referring to FIG. 1 and FIG. 2. In the EUV reticle pod 100 of the present embodiment of the invention, the upper cover 130 is used for engaging with the lower cover 120 for containing the reticle R. Practically, when the reticle R is held on the lower cover 120, sometimes the reticle R is tilted due to mis-placement or mis-alignment, and one or more corners of the reticle R are not supported by one or more supporting elements 121. The pressing unit 140 is used here to press the reticle R so that each corner of the reticle R can be properly supported by the supporting element 121.

In one embodiment, the method of putting the reticle R into the EUV reticle pod 100 is by performed by a robotic arm and generally includes the following steps. First, the reticle R is placed on the lower cover 120, and then the upper cover 130 is brought into engagement with the lower cover 120 to form the inner assembly 110. Second, the inner assembly 110 containing reticle R therein is placed onto the base 160, and then the outer cover 170 is closed onto the base 160. While closing on the outer cover 170, the pushing surface 171 of the outer cover 170 contacts and continues to push the pressing element 141, and the reticle R can be subsequently pushed into correct position by the pressing element 141. The reticle R can be fixed by being pressed from its upper side and being supported from its lower sides by the pressing unit 140 and the supporting element 121 respectively.

Figure 4A:
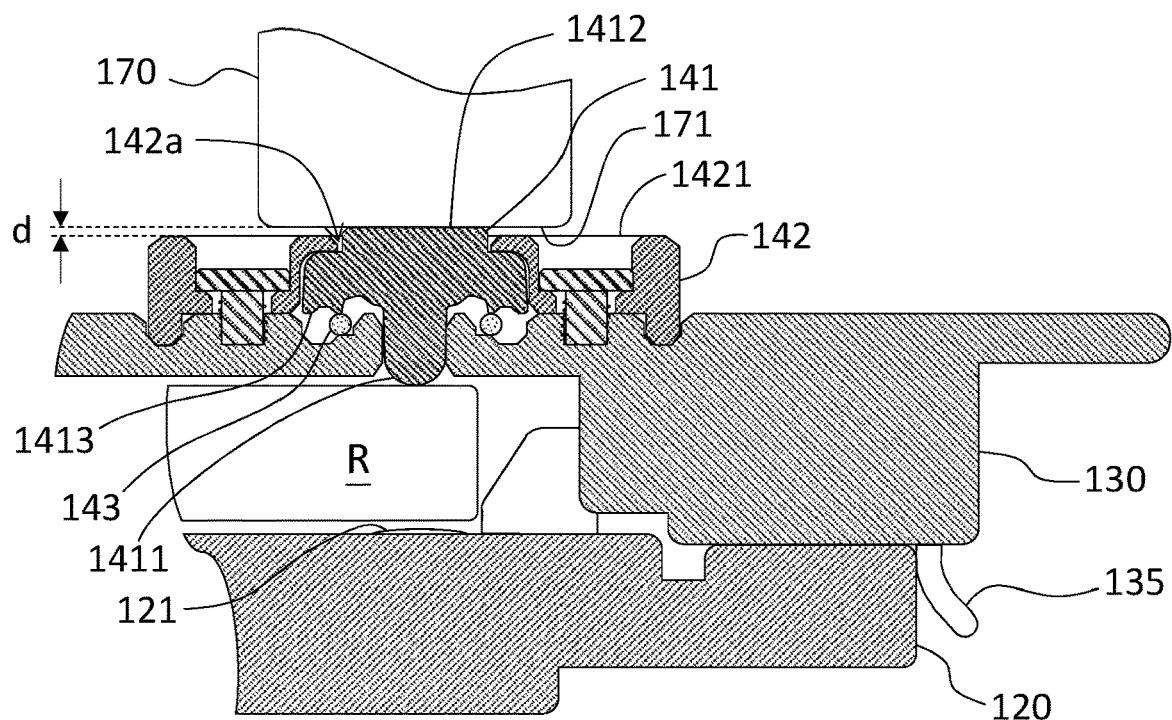
FIG. 4a is a schematic diagram of the pushing surface contacting the pressing element.

Please refer to FIG. 1 and FIG. 4a. FIG. 4a is a schematic diagram of the pushing surface contacting the pressing element. In the EUV reticle pod 100, the pressing element 141 pushes the reticle R to the correct position along the travel distance of the pressing element 141. The travel distance of the pressing element 141 will be elaborated in the below.

When the outer cover 170 is brought into contact and engages with the base 160, the pushing surface 171 of the outer cover 170 contacts the pressure receiving part 1412 of the pressing element 141. An upper surface of the pressure receiving part 1412 is a flat surface and is used to form the surface-to-surface contact with the pushing surface 171. The area of the pushing surface 171 is greater than the area of the upper surface of the pressure receiving part 1412, so the pressure receiving part 1412 is covered entirely by the pushing surface 171 and can be evenly pushed by the pushing surface 171. The problem of tilted pressing element 141 can be prevented. The pressure receiving part 1412 extends through the window 142a of the limiting cap 142 and is protruded a distance d outwardly from the top surface 1421. At this moment, the pushing surface 171 solely contacts the pressure receiving part 1412, and the pressing part 1411 does not contact the reticle R. In other embodiments, the pressing part 1411 could have been in contact with the reticle R according to the vertical location of the reticle R based on actual situation.

Figure 4B:
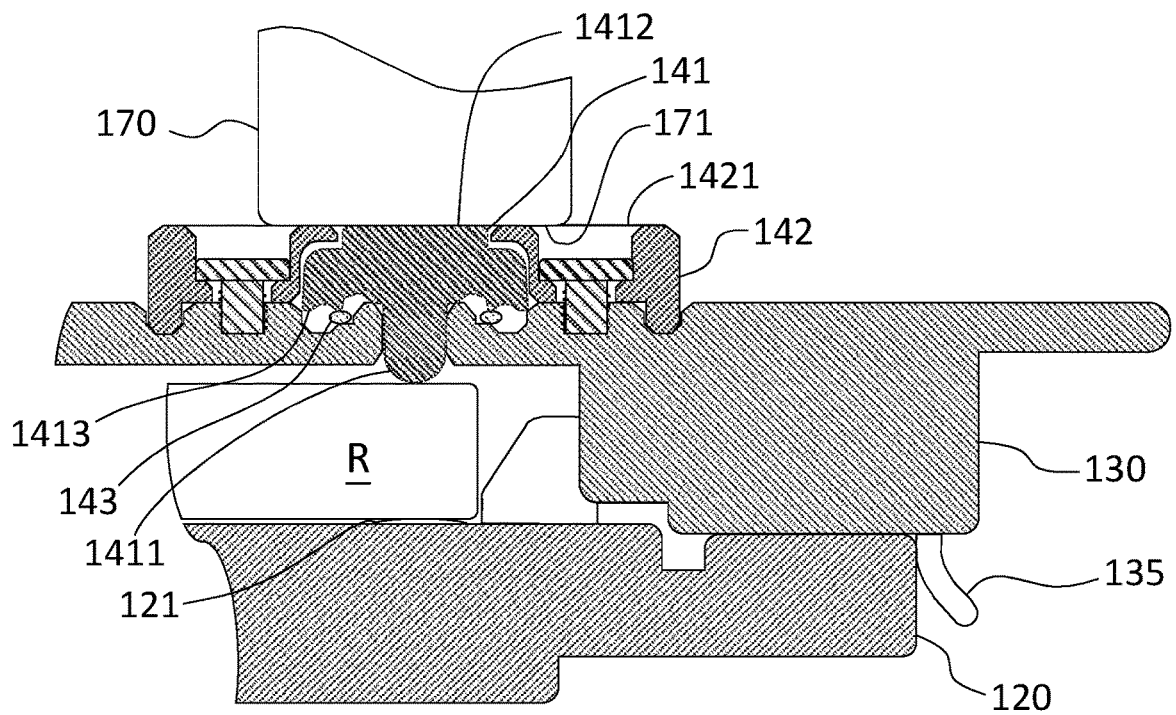
FIG. 4b is a schematic diagram of the pressing element at one end of the travel distance.

Please refer to FIG. 1 and FIG. 4b. FIG. 4b is a schematic diagram of the pressing element at one end of the travel distance. As the outer cover 170 gets closer to the base 160, the pushing surface 171 continues pushing down the pressing element 141, and the pressing element 141 continues pressing down the reticle R until the pressing element 141 reaches one end of the travel distance. By utilizing the characteristic of vertical movement of the robotic arm, during the pressing process, the pushing surface 171 with larger area can remain the surface-to-surface contact with the upper surface of the pressure receiving part 1412. When the pressing element 141 reaches one end of the travel distance, the top surface 1421 of the limiting cap 142 and upper surface of the pressure receiving part 1412 are situated on the same horizontal level. The pushing surface 171 simultaneously presses against the pressure receiving part 1412 and the top surface 1421. The material of the limiting cap 142 can be exemplified by metal, alloy, or similar material, which exhibits better structural strength. The top surface 1421 of the limiting cap 142 can be regarded as the end point of pressing the pressing element 141, i.e. one end of the travel distance, to limit the movement of the pressing element 141. To sum up, by using the limiting cap 142, the excess amount of pressure applied on the reticle R can be suppressed, and the pressure applying to the reticle R can be controlled within the design range. The upper side of the reticle R is pressed by the pressing part 1411 and the lower side of the reticle R is supported by the supporting element 121; the reticle R can be firmly fixed in this manner.

Figure 5:
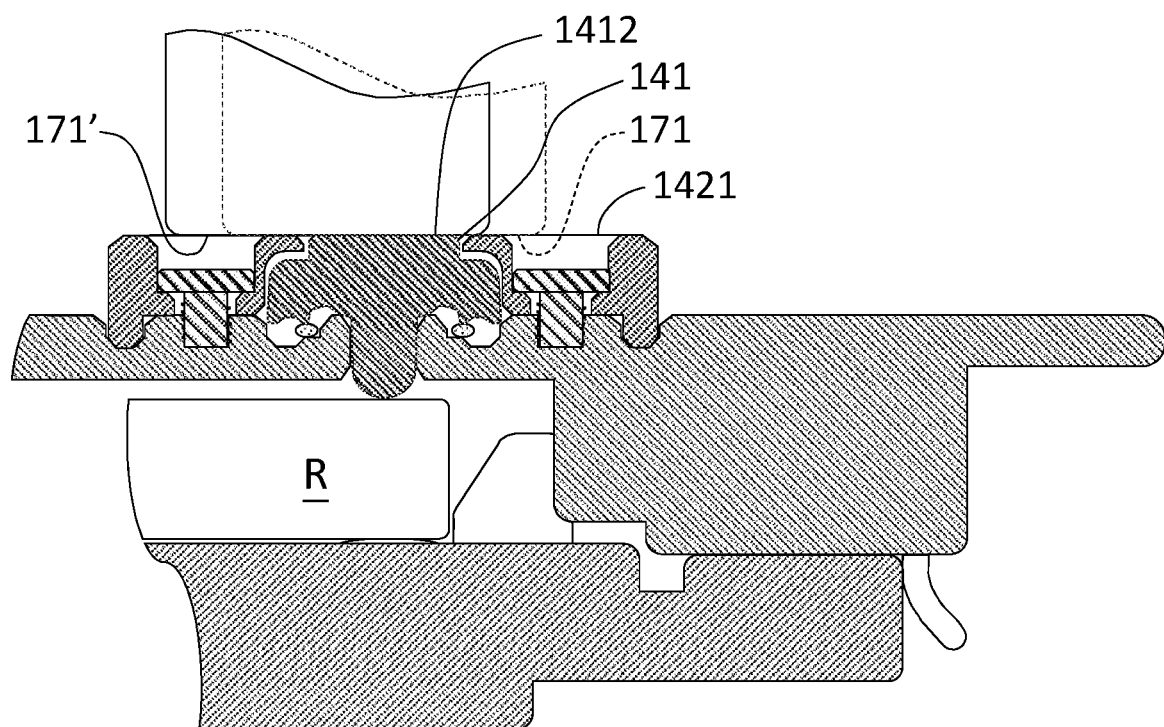
FIG. 5 is a schematic diagram of the pushing surface pushing at a different location.

Please refer to FIG. 1, FIG. 4b, and FIG. 5. FIG. 5 is a schematic diagram of the pushing surface pushing at a different location. When the assembly tolerance of different components accumulates in the EUV reticle pod 100, the location on the top surface 1421 at which the pushing surface 171 pushes may shift. By comparison, the location at which the pushing surface 171' pushes in FIG. 5 is slightly left to the one that the pushing surface 171 pushes in FIG. 4b (as shown by the dashed lines in FIG. 5). Due to the reason that the pushing surface 171' has the larger area, even when the location being pushed is shifted, the surface-to-surface contact with the upper surface of the pressure receiving part 1412 is maintained. When the pressing element 141 reaches one end of the travel distance, the pushing surface 171 remains surface-to-surface contact with the pressure receiving part 1412 and the top surface 1421, and, equivalently, the accumulation of assembly tolerance of components is neutralized.

As shown in FIG. 1, the outer cover 170 of the present embodiment has a protruded stage structure, and the pushing surface 171 is the exposed surface of the protruded stage structure. The protruded stage structure and the outer cover 170 are integrally formed in one piece. In a different embodiment, the outer assembly 150 includes several pushing elements disposed on the surface of the outer cover 170 facing the upper cover 130, and the pushing surface 171 is the exposed surface of the pushing elements. Practically, whether by utilizing the structure of the outer cover 170 itself or by disposing additional elements on the outer cover 170, any other means for providing the pushing surface to be in surface-to-surface contact with the pressing element 141 can be used in the present invention.

Figure 6:
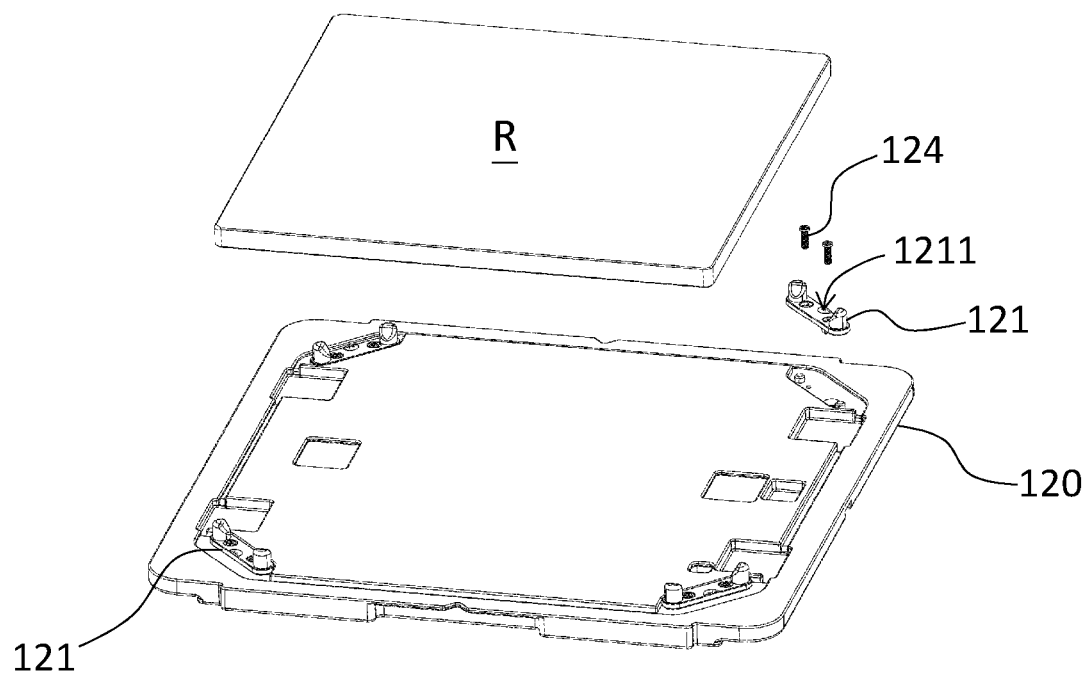
FIG. 6 is a schematic diagram of the lower cover and the reticle of FIG. 1.
Figure 7:
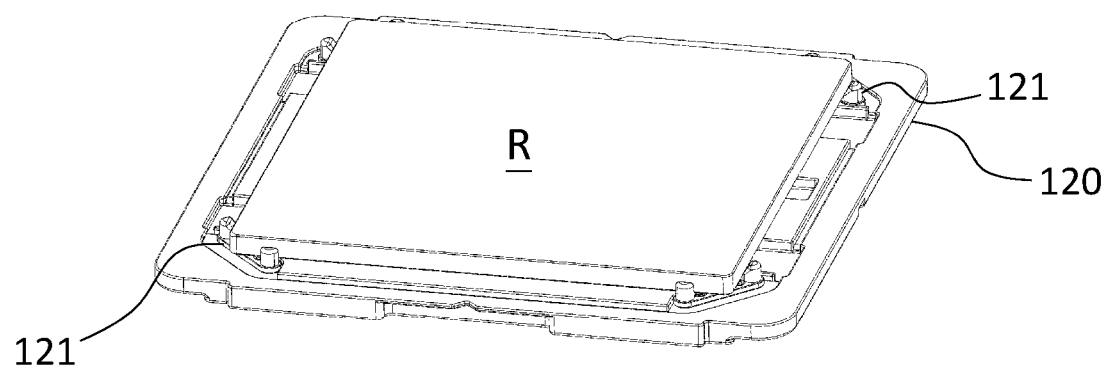
FIG. 7 is a schematic diagram of the reticle held on the lower cover of FIG. 6.

Please refer to FIG. 6 and FIG. 7 at the same time. FIG. 6 is a schematic diagram of the lower cover and the reticle of FIG. 1, and FIG. 7 is a schematic diagram of the reticle held on the lower cover of FIG. 6. In the present embodiment, the lower cover 120 is exemplified by including four supporting elements 121. Each supporting element 121 is configured to be disposed near one of the four corners of the reticle R, such that each corner of the reticle R can be supported by one of the supporting elements 121. Each supporting element 121 has a supporting bump 1211 through which the reticle R can be supported upwardly on its lower side. The supporting element 121 can be exemplified by an integrally formed structure of erosion resistance polymer, which not only reduces particles but also increases the structural strength to properly support the reticle R on the lower cover 120.

The lower cover 120 further includes a second screwing element 124 for screwing the supporting elements 121 onto the lower cover 120. Although, here in the present embodiment, the supporting elements 121 are fixed onto the lower cover 120 by the second screwing element 124, the technology of the present invention is not limited hereto. Any other means for fixing the supporting elements 121 onto the lower cover 120 are eligible to be used herein.

In relation to the previously-described four supporting elements 121, the upper cover 130 of the present embodiment includes four pressing units 140 (as shown in FIG. 1) corresponding to the supporting elements 121. Each corner of the reticle R is pressed by one of the pressing units 140. By way of the above, the four corners of the reticle R can be supported on the lower side by the supporting elements 121 and can be pressed on the upper side by the pressing units 140. The force can be applied to the reticle R evenly, and the problems resulted from the reticle R being applied with uneven forces can be prevented, and the reticle R can be properly held and fixed in the inner assembly 110.

Please continue referring to FIG. 1 and FIG. 4a. The upper cover 130 of the present embodiment further includes several guiding members 135. The guiding members 135 are disposed on the upper cover 130 and configured in a way that they extend towards the lower cover 120. The guiding members 135 are used for elastically contacting the peripheral of the lower cover 120. When conducting the engagement of the lower cover 120 and the upper cover 130, the guiding members 135 facilitate the alignment between the two so they can be engaged with each other correctly. In the present embodiment, the guiding members 135 are distributed near the four corners of the upper cover 130. However, the number and the disposition of the guiding members 135 are not limited hereto. Any other means for extending toward the lower cover 120 and elastically contacting the peripheral of the lower cover 120 as the upper cover 130 engages with the lower cover 120, can be regarded as the guiding members 135 of the present invention.

Figure 8:
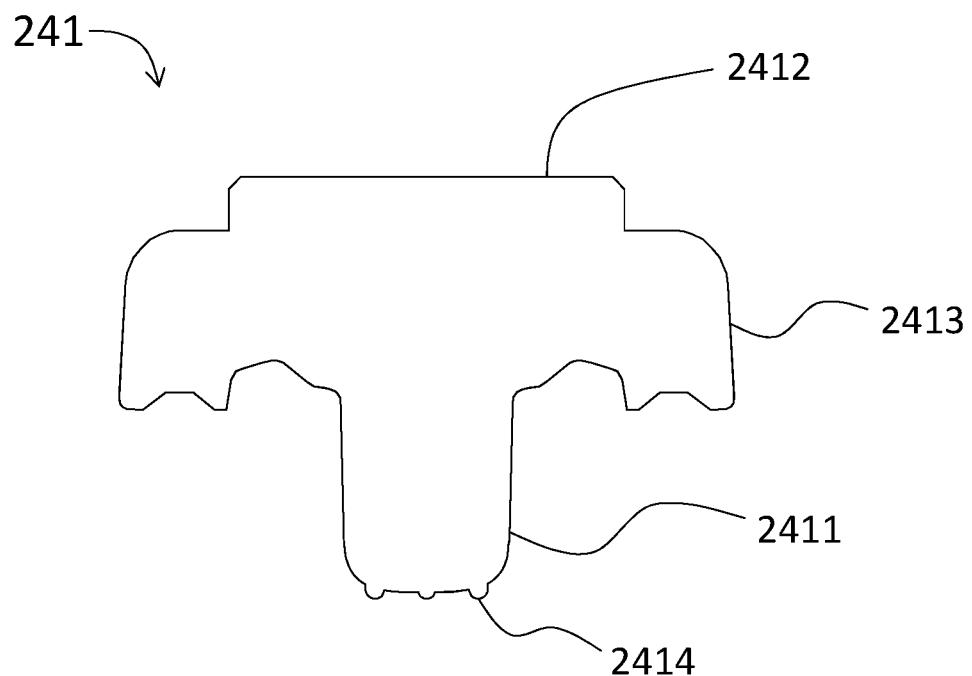
FIG. 8 is a schematic diagram of a pressing element according to another embodiment of the invention.

In the embodiments described in the above with reference to FIG. 1 to FIG. 7, the reticle R is touched by the pressing element 141 through one contact point. To be more specific, the reticle R is touched by the tip of the pressing part 1411 of the pressing element 141 through a single-point contact. However, the technology of the invention is not limited hereto. The reticle R can be touched by the pressing element 141 through a multi-point contact. Please refer to FIG. 8, which is a schematic diagram of a pressing element according to another embodiment of the invention. The pressing element 241 has a pressing part 2411 and a pressure receiving part 2412 which are oppositely arranged, and a shoulder part 2413 whose two sides are connected to the pressing part 2411 and the pressure receiving part 2412 respectively. The pressing element 241 here is different from the pressing element 141 of FIG. 3 in that several contact points 2414 are disposed on the pressing element 241. These contact points 2414 are arranged at one end of the pressing part 2411 and are substantially situated on the same horizontal level so as to be in contact with the reticle R (reticle R is the same as in FIG. 4b) at the same time. By using multiple contact points 2414 to touch the reticle R, the pressure applied to the reticle R per unit area can be decreased, which further lowers the chance of damaging the reticle R and reduces particles as well.

Figure 9:
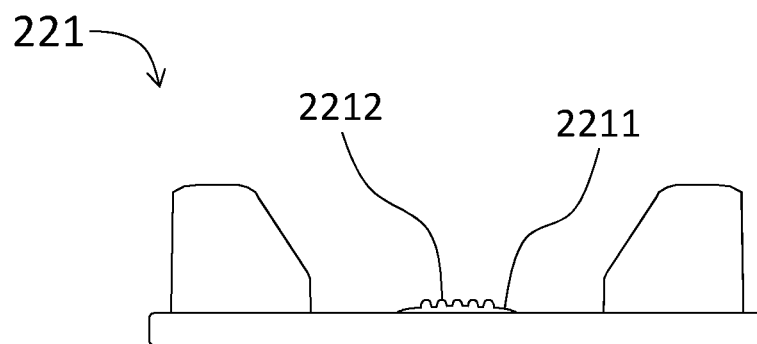
FIG. 9, which is a schematic diagram of a supporting element according to another embodiment of the invention

In the embodiments described in the above with reference to FIG. 1 to FIG. 7, the reticle R is touched by the supporting bump 1211 through one supporting point. The reticle R is touched by supporting element 121 through a single-point contact of the supporting bump 1211. However, the technology of the invention is not limited hereto. The reticle R can be touched by the supporting element 121 through a multi-point contact. Please refer to FIG. 9, which is a schematic diagram of a supporting element according to another embodiment of the invention. The supporting element 221 has a supporting bump 2211, and several supporting points 2212 are disposed on and protruded from the supporting bump 2211. These supporting points 2212 are substantially situated on the same horizontal level to be in contact with the reticle R (reticle R is the same as in FIG. 4b) at the same time. By using multiple supporting points 2212 to touch the reticle R, the pressure applied to the reticle R per unit area can be decreased, which further lowers the chance of damaging the reticle R and reduces particles.

According to yet another embodiment of the invention, a pressing unit for pressing a reticle is provided. The pressing unit is configured to be used in a reticle pod. The reticle pod in the present embodiment can be exemplified by an EUV reticle pod for containing the reticle of extreme ultraviolet photolithography process. The reticle pod includes an outer cover, a lower cover, and an upper cover for engaging with the lower cover to contain the reticle. The pressing unit includes a pressing element and a limiting cap. The pressing element has a pressing part and a pressure receiving part which are oppositely arranged, and the pressing part extends through the upper cover for pressing against the reticle. The limiting cap is disposed on the upper cover and covers the pressing element, and the pressure receiving part extends through the limiting cap and is protruded outwardly from a top surface of the limiting cap. The outer cover and the reticle are respectively situated on two opposite sides of the upper cover, and the outer cover has a pushing surface for forming a surface-to-surface contact with the pressure receiving part and for simultaneously pressing against the pressure receiving part and the top surface. The top surface of the limiting cap is regarded as one end of the travel distance of the pressing element to avoid the problems relating to excess amount of pressure. Additionally, through the surface-to-surface contact between the pushing surface and the pressure receiving part, the pressure receiving part can be pushed evenly. The problems relating to uneven force application on the pressing element can be avoided accordingly.

According to the above-mentioned embodiments of the reticle pressing unit and EUV reticle pod using the same, the reticle pod includes the inner assembly and the outer assembly. The inner assembly includes the lower cover and the upper cover for containing the reticle. The lower cover includes the supporting element for supporting the reticle. The upper cover is used for engaging with the lower cover and includes the pressing unit for pressing the reticle. The pressing unit includes the pressing element and the limiting cap. The pressing element has the pressing part and the pressure receiving part which are oppositely arranged. The pressing part extends through the upper cover to press against the reticle. The limiting cap is disposed on the upper cover and covers the pressing element. The pressure receiving part extends through the top surface and is protruded upwardly from the top surface of the limiting cap. The outer assembly is used for containing the inner assembly and includes the base and the outer cover which are used for engaging with each other. The outer cover has the pushing surface for forming the surface-to-surface contact with the pressure receiving part, and for pressing against the pressure receiving part and the top surface at the same time. Through the surface-to-surface contact between the pushing surface and the pressure receiving part of the pressing element, the problems relating to tilted pressing element and the reticle applied with uneven forces by different pressing elements can be avoided. By using the pushing surface to press against the top surface of the limiting cap and the pressure receiving part at the same time, the travel distance and the amount of the force can be controlled. The excess amount of force applying to the reticle can be suppressed, the pressure applied on the reticle can be limited, and thus the pressure can be prevented from damaging the reticle. Moreover, since the pressing element is covered and pressed entirely by the pushing surface, even in the case that the pressing location is shifted, the surface-to-surface contact is maintained, and thus the accumulation of assembly tolerance of components can be neutralized.

The ordinal numbers used in the detailed description and claims, such as "first" and "second" do not necessarily indicate their priority orders or up and down directions; on the contrary, they are merely intended to distinguish different elements. It will be apparent to those skilled in the art that various modifications and variations can be made to the structure of the present invention without departing from the scope or spirit of the invention. In view of the foregoing, it is intended that the present invention covers modifications and variations of this invention, provided they fall within the scope of the following claims.

What is claimed is:

1. An EUV reticle pod comprising:
    an inner assembly for containing a reticle, comprising:
        a lower cover comprising a supporting element for supporting the reticle;
        an upper cover for engaging with the lower cover;
        a pressing unit disposed on the upper cover for pressing the reticle, comprising:
            a pressing element having a pressing part and a pressure receiving part which are oppositely arranged, and the pressing part extending through the upper cover for pressing against the reticle; and
            a limiting cap disposed on the upper cover and covering the pressing element, and the pressure receiving part extending through the limiting cap and protruded outwardly from a top surface of the limiting cap; and
    an outer assembly for containing the inner assembly, comprising:
        a base and an outer cover for engaging with each other, and the outer cover having a pushing surface for forming a surface-to-surface contact with the pressure receiving part and for simultaneously pressing against the pressure receiving part and the top surface;
    wherein the pressing element has a travel distance, and the top surface and an upper surface of the pressure receiving part are situated on the same horizontal level when the pressing element reaches one end of the travel distance.

2. The EUV reticle pod according to claim 1, wherein the pressing element further has a shoulder part whose two sides respectively connected to the pressure receiving part and the pressing part, and the shoulder part is confined between the limiting cap and the upper cover.

3. The EUV reticle pod according to claim 2, wherein the pressing unit further comprises an elastic element disposed between the upper cover and the shoulder part for elastically contacting with the shoulder part.

4. The EUV reticle pod according to claim 3, wherein the pressing part extends through a through hole of the upper cover, and the elastic element has a circular structure surrounding the through hole.

5. The EUV reticle pod according to claim 2, wherein the pressure receiving part extends through a window of the limiting cap, and a width of the shoulder part is greater than a width of the pressure receiving part and a width of the window.

6. The EUV reticle pod according to claim 1, wherein the reticle is touched by the pressing element through one or more contact points.

7. The EUV reticle pod according to claim 1, wherein the reticle is touched by the supporting element through one or more supporting points.

8. The EUV reticle pod according to claim 1, wherein the lower cover comprises a plurality of the supporting elements disposed near a plurality of corners of the reticle and each corner is supported by one of the supporting elements, and the upper cover comprises a plurality of the pressing units corresponding to the supporting elements and each corner is pressed by one of the pressing units.

9. A pressing unit for a reticle configured to be used in an EUV reticle pod comprising an outer cover, a lower cover, and an upper cover for engaging with the lower cover to contain the reticle, the pressing unit comprising:

a pressing element having a pressing part and a pressure receiving part which are oppositely arranged, and the pressing part extending through the upper cover for pressing against the reticle; and a limiting cap disposed on the upper cover and covering the pressing element, and the pressure receiving part extending through the limiting cap and protruded outwardly from a top surface of the limiting cap;

wherein the outer cover and the reticle are respectively situated on two opposite sides of the upper cover, and the outer cover has a pushing surface for forming a surface-to-surface contact with the pressure receiving part and for simultaneously pressing against the pressure receiving part and the top surface; and wherein the pressing element has a travel distance, and the top surface and an upper surface of the pressure receiving part are situated on the same horizontal level when the pressing element reaches one end of the travel distance.

* * * * *